(12) United States Patent
Kozinsky et al.

(10) Patent No.: US 9,531,001 B2
(45) Date of Patent: Dec. 27, 2016

(54) BATTERY CELL WITH FLEXIBLE WIRELESS TEMPERATURE SENSOR

(71) Applicant: Robert Bosch GmbH, Stuttgart (DE)

(72) Inventors: Boris Kozinsky, Waban, MA (US); Inna Kozinsky, Mountain View, CA (US); John F. Christensen, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 548 days.

(21) Appl. No.: 13/926,615

(22) Filed: Jun. 25, 2013

(65) Prior Publication Data

US 2013/0344355 A1 Dec. 26, 2013

Related U.S. Application Data

(60) Provisional application No. 61/663,952, filed on Jun. 25, 2012.

(51) Int. Cl.

| | |
|---|---|
| *H01M 2/34* | (2006.01) |
| *G01R 31/36* | (2006.01) |
| *B60L 11/18* | (2006.01) |
| *G01K 1/02* | (2006.01) |
| *G06K 19/07* | (2006.01) |

(Continued)

(52) U.S. Cl.
CPC ............ *H01M 2/348* (2013.01); *B60L 3/0046* (2013.01); *B60L 3/04* (2013.01); *B60L 11/1853* (2013.01); *B60L 11/1861* (2013.01); *B60L 11/1864* (2013.01); *B60L 11/1872* (2013.01); *B60L 11/1879* (2013.01); *G01K 1/024* (2013.01); *G01R 31/3606* (2013.01); *G06K 19/0717* (2013.01); *G06K 19/0723* (2013.01); *H01M 10/486* (2013.01); *H02J 7/0022* (2013.01); *H02J 7/0091* (2013.01); *B60L 2240/545* (2013.01); *B60L 2240/547* (2013.01); *B60L 2240/549* (2013.01); *Y02T 10/7005* (2013.01);

(Continued)

(58) Field of Classification Search
CPC ..................................................... H01M 2/348
USPC .............................................. 429/50, 90, 62
See application file for complete search history.

(56) References Cited

U.S. PATENT DOCUMENTS

| | | |
|---|---|---|
| 5,596,567 A | 1/1997 | deMuro et al. |
| 7,800,510 B2 | 9/2010 | Densham |

(Continued)

FOREIGN PATENT DOCUMENTS

| | | |
|---|---|---|
| EP | 1042138 B1 | 5/2007 |
| EP | 2328173 A1 | 6/2011 |
| WO | WO 2011123808 | * 10/2011 |

OTHER PUBLICATIONS

International Search Report and Written Opinion for Corresponding Application (i.e., PCT/US2013/047641), mailed Sep. 25, 2013 (14 pages).

(Continued)

*Primary Examiner* — Stewart Fraser
*Assistant Examiner* — Rachel L Zhang
(74) *Attorney, Agent, or Firm* — Maginot Moore & Beck LLP

(57) ABSTRACT

A battery system in one embodiment includes a first battery cell including a shell encasing a positive electrode, a negative electrode, and a separator positioned between the positive electrode and the negative electrode, and at least one first wireless temperature sensor assembly encased within the first shell.

10 Claims, 4 Drawing Sheets

(51) Int. Cl.
*H01M 10/48* (2006.01)
*H02J 7/00* (2006.01)
*B60L 3/00* (2006.01)
*B60L 3/04* (2006.01)

(52) U.S. Cl.
CPC ........ *Y02T 10/7011* (2013.01); *Y02T 10/7044* (2013.01); *Y02T 10/7061* (2013.01)

(56) References Cited

U.S. PATENT DOCUMENTS

| | | | |
|---|---|---|---|
| 2001/0044044 A1 | 11/2001 | Kaito et al. | |
| 2003/0185278 A1 | 10/2003 | Roepke et al. | |
| 2005/0136301 A1 | 6/2005 | Knaggs et al. | |
| 2005/0202310 A1 | 9/2005 | Yahnker et al. | |
| 2006/0152190 A1 | 7/2006 | Riemschneider | |
| 2007/0072014 A1 | 3/2007 | Kim et al. | |
| 2008/0090134 A1 | 4/2008 | Berg | |
| 2008/0129252 A1 | 6/2008 | Nishino | |
| 2009/0109099 A1 | 4/2009 | Jang et al. | |
| 2009/0123814 A1* | 5/2009 | Cabot | H01M 10/052 429/50 |
| 2010/0179778 A1 | 7/2010 | Goff et al. | |
| 2010/0196744 A1* | 8/2010 | Tucholski | G06K 19/0702 429/7 |
| 2011/0171505 A1 | 7/2011 | Kishll et al. | |
| 2012/0143356 A1* | 6/2012 | Berg-Sonne | G05B 15/02 700/49 |
| 2012/0155507 A1 | 6/2012 | Srinivasan et al. | |

OTHER PUBLICATIONS

Abad et al, "Fabrication and Encapsulation Processes for Flexible Smart RFID Tags", Radio Frequency Identification Fundamentals and Applications, Design Methods and Solutions, 2010, Europe (14 pages).

Fung et al, "Ultra-low-power Polymer Thin Film Encapsulated Carbon Nanotube Thermal Sensors", 4th IEEE Conference on Nanotechnology; 2004; pp. 158-160; Hong Kong (3 pages).

Knights, "Bottles Now Have Embedded RFID", Plastics Technology; http://www.ptonline.com/articles/bottles-now-have embedded-rfid; 2009 (2 pages).

* cited by examiner

BATTERY CELL WITH FLEXIBLE WIRELESS TEMPERATURE SENSOR

This application claims the benefit of U.S. Provisional Application No. 61/663,952, filed on Jun. 25, 2012, the entire contents of which are herein incorporated by reference.

TECHNICAL FIELD

This invention relates to batteries.

BACKGROUND

When batteries are charged or discharged, they typically generate heat due to a finite internal resistance that includes ohmic, mass-transfer, and kinetic terms. Exothermic side reactions can also generate heat within the battery. This heat generation can pose a safety risk if it is large and rapid. For instance, commercial Li-ion cells generally go into thermal runaway if the internal cell temperature climbs above the decomposition temperature of the cathode (~180 to 220° C., depending upon the chemistry and the state of charge). Often, the events that lead to a temperature rise above this critical temperature are triggered at much lower temperatures. For example, exothermic anode film decomposition can occur at ~120° C., providing enough energy to raise the battery temperature above 180° C.

Even at lower temperatures, undesired damage can occur. For example, at milder temperatures (40 to 100° C. for Li-ion batteries), aging of the battery is usually accelerated. This is due to the fact that most detrimental side reactions are thermally activated (although not all aging mechanisms in batteries are accelerated at high temperature). It is therefore advisable to cool batteries during operation and/or at high ambient temperatures in order to enhance their cycle and/or calendar life. There are numerous cooling concepts for commercial batteries, including active air cooling, liquid cooling, the use of phase-change materials, and the use of materials with high thermal conductivity.

While battery integrity and health are significant concerns, the incorporation of batteries such as Li-ion batteries, into vehicle implicates additional concerns. Overheating of vehicular batteries during operation or storage may cause cathode materials to release oxygen gas, which reacts exothermally with the organic electrolyte. Such runaway reactions can also be caused by metallic impurities or Li dendrites that causing short-circuits between the anode and the cathode.

Therefore, being able to monitor temperature of Li-ion cells is critical in preventing catastrophic failures, as well as maintaining optimal health of batteries by reducing thermal aging. Studies show that during runaway events the temperature distribution in the cell is very non-homogeneous and it may take minutes for the thermal runaway reaction to accelerate and become irreversible. The surface temperature of the cell, however, may not show any change until it is too late to mitigate the failure. So advance knowledge of the internal cell temperature is very important, and the best way to obtain internal cell temperature is via a temperature sensor embedded inside the cell.

Incorporation of a temperature sensor into a cell is not easily accomplished. For example, the design and manufacturing process of Li-ion cells are very cost-sensitive and have been thoroughly optimized for the 18650 geometries and larger formats. In Li-ion cells of this format, a multiple-layer cathode-anode sandwich or roll is typically hermetically encased in a steel container. It is difficult and costly to re-design a cell that would include a thermistor inside with a dedicated par of contacts on the exterior casing of the cell.

What is needed therefore is a system which provides timely information regarding the internal temperature of a cell. Such a system which does not implicate significant design changes to the cell would be beneficial.

SUMMARY

In one embodiment a battery system in one embodiment includes a first battery cell including a shell encasing a positive electrode, a negative electrode, and a separator positioned between the positive electrode and the negative electrode, and at least one first wireless temperature sensor assembly encased within the first shell.

In another embodiment a method of controlling a battery system, includes providing a first battery cell including a shell encasing a positive electrode, a negative electrode, and a separator positioned between the positive electrode and the negative electrode, transmitting first temperature data from a first wireless temperature sensor assembly encased within the first shell, receiving the first temperature data at a processor, and controlling a first switch with the processor between a first position whereat the first battery cell is connected to a battery cell circuit, and a second position whereat the first battery cell is electrically isolated from the battery cell circuit based upon the received first temperature data.

DETAILED DESCRIPTION

Figure 1:
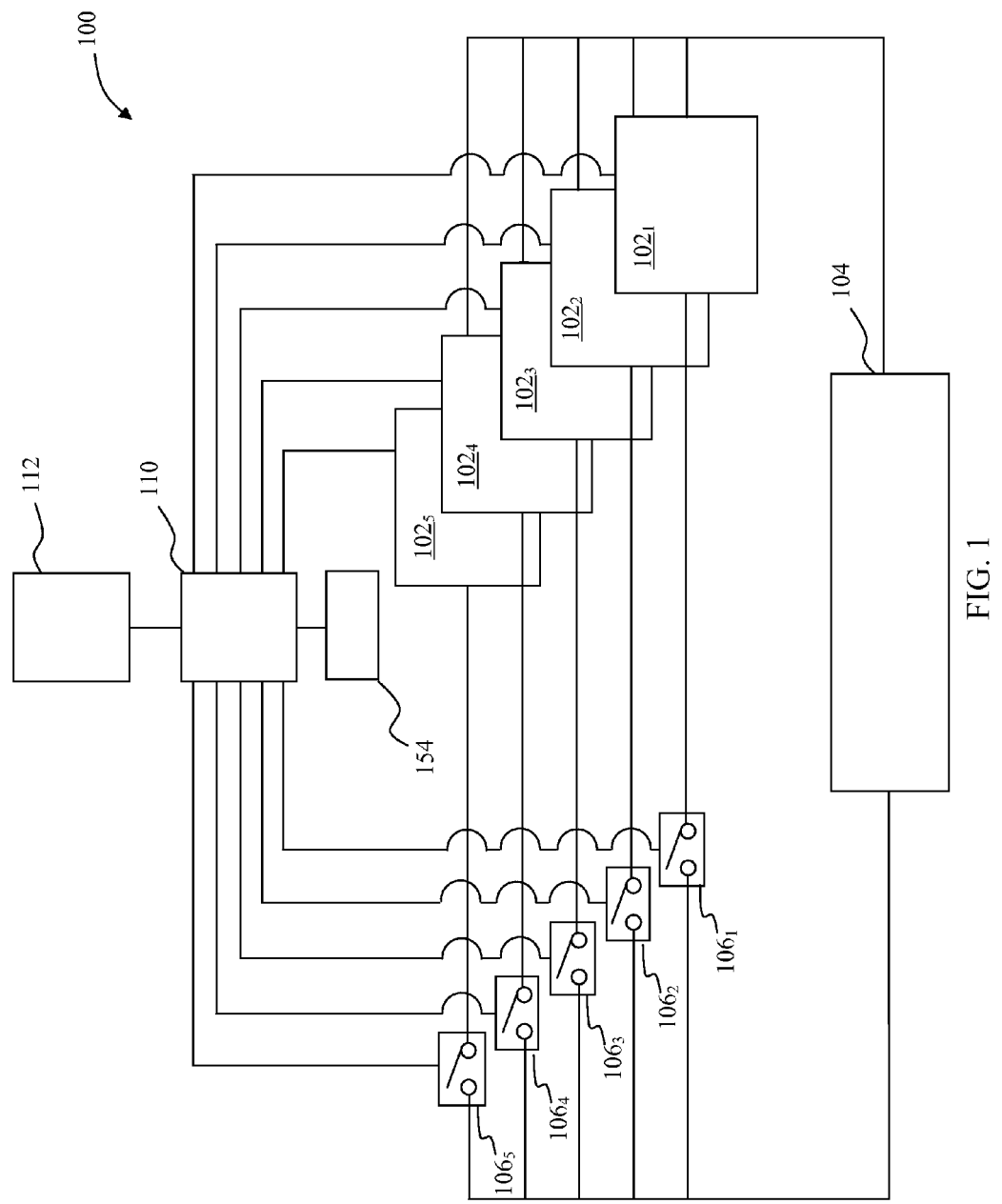
FIG. 1 depicts a simplified schematic of a battery system including several electrochemical cell packs which can be independently controlled.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a battery system 100 including several lithium-ion battery cell packs $102_x$. In the embodiment of FIG. 1, five battery cell packs $102_{1\text{-}5}$ are depicted. In alternative embodiments, more or fewer battery cell packs of different or the same chemistry may be provided. Each of the lithium-ion battery cell packs $102_x$ is selectively connected to a load or voltage source 104 through a respective switch $106_x$. Each of the switches $106_x$ are controlled by a processor 110 which is operably connected to a memory 112. Various command instructions, discussed in further detail below, are programmed into the memory 112. The processor 110 is operable to execute the command instructions programmed into the memory 112.

Figure 2:
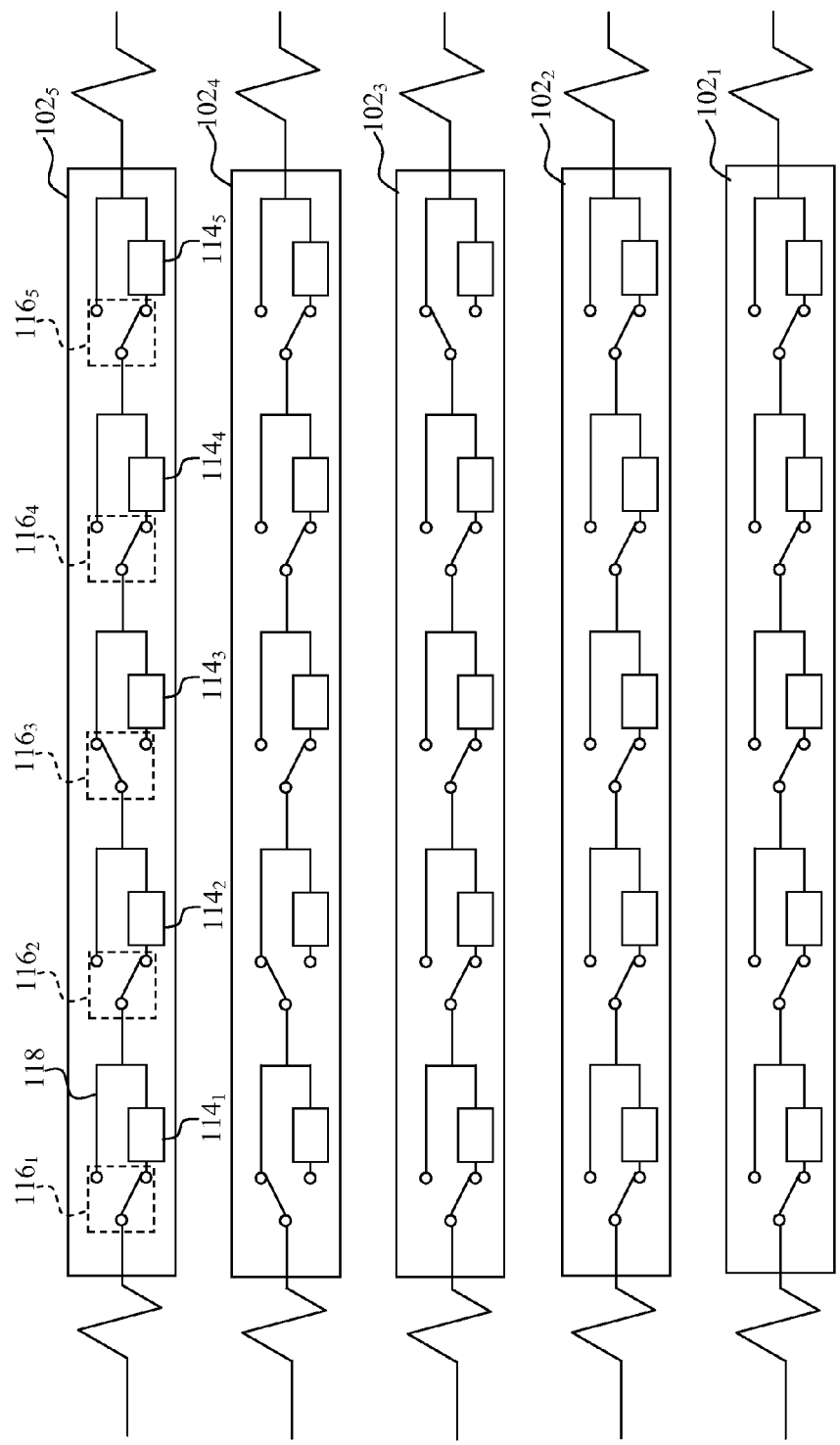
FIG. 2 depicts a simplified schematic of the cell packs of FIG. 1 showing the independently controlled connection switches for each of the electrochemical cells within the electrochemical cell packs.

The lithium-ion battery cell packs $102_x$ in this embodiment are identical and are described in further detail with reference to FIG. 2 and the lithium-ion battery cell pack $102_5$. The lithium-ion battery cell pack $102_5$ includes five lithium-ion battery cells $114_{1-5}$. A two-way connection switch $116_{1-5}$ is associated with each of the battery cells $114_{1-5}$. The connection switches $116_{1-5}$, which are independently controlled by the processor 110 (control lines are omitted for clarity), can alternatively connect the respective battery cells $114_{1-5}$ to an internal battery cell circuit 118 or bypass the respective battery cell $114_{1-5}$. In FIG. 2, the connection switches $116_{1, 2, 4, and 5}$ are positioned to connect the respective battery cells $114_{1, 2, 4, and 5}$ to the battery cell circuit 118 while the connection switch $116_3$ is positioned to a bypass position whereby the respective battery cell $114_3$ is effectively electrically isolated from the battery cell circuit 118.

Figure 3:
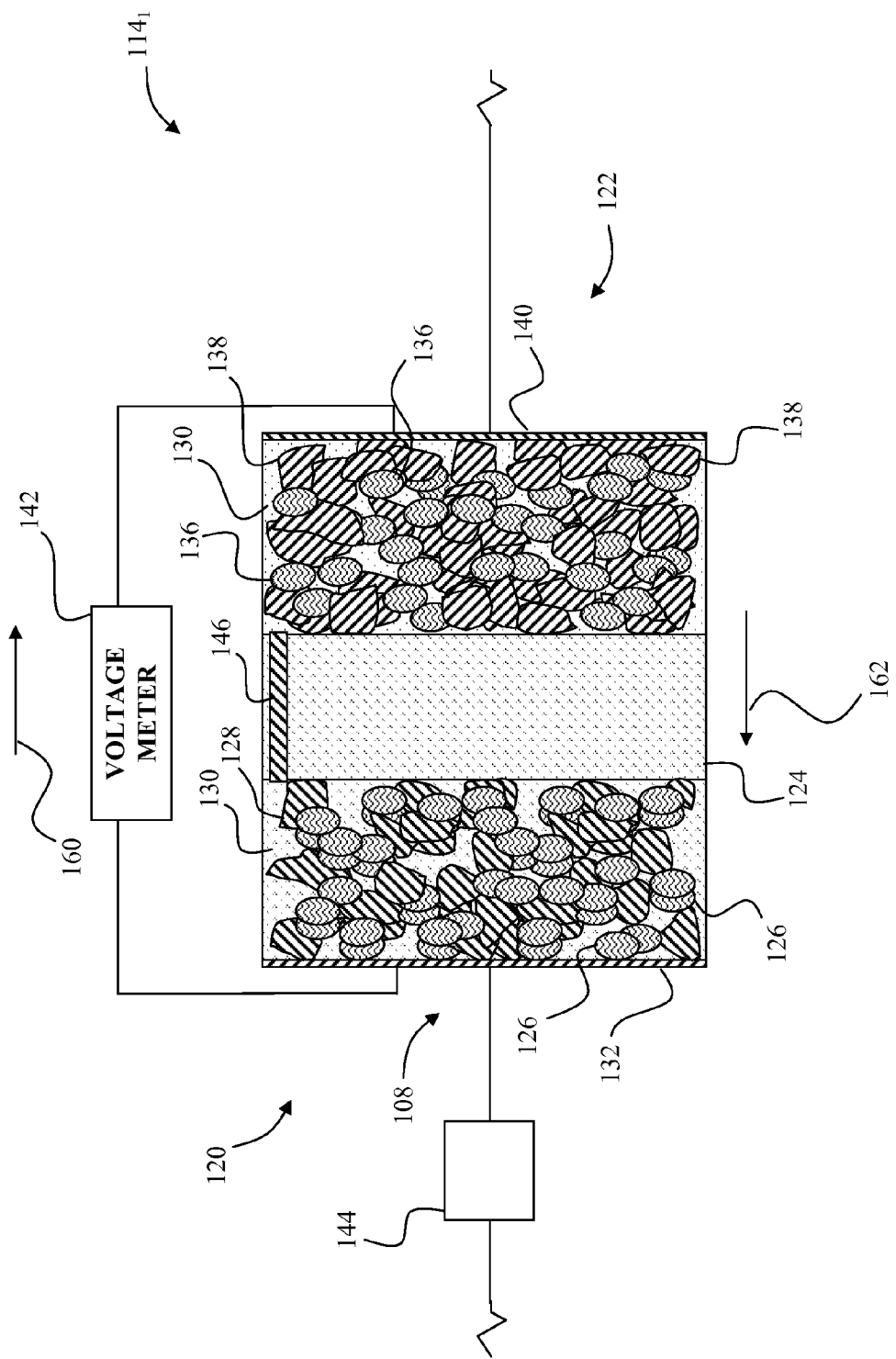
FIG. 3 depicts a schematic of one of the electrochemical cells of FIG. 1 showing a wireless temperature sensor embedded within the cell.

The lithium-ion battery cells $114_{1-5}$ in this embodiment are identical and are described in further detail with reference to the lithium-ion battery cell $114_1$ shown in FIG. 3. The lithium ion cell $114_1$ includes a negative electrode 120, a positive electrode 122, and a separator region 124 between the negative electrode 120 and the positive electrode 122. The negative electrode 120 includes active materials 126 into which lithium can be inserted, inert materials 128, electrolyte 130 and a current collector 132.

The negative electrode 120 may be provided in various alternative forms. The negative electrode 120 may incorporate dense Li metal or a conventional porous composite electrode (e.g., graphite particles mixed with binder). Incorporation of Li metal is desired since the Li metal affords a higher specific energy than graphite.

The separator region 124 includes an electrolyte with a lithium cation and serves as a physical and electrical barrier between the negative electrode 120 and the positive electrode 122 so that the electrodes are not electronically connected within the battery cell $114_1$ while allowing transfer of lithium ions between the negative electrode 120 and the positive electrode 122.

The positive electrode 122 includes active material 136 into which lithium can be inserted, inert material 138, the electrolyte 130, and a current collector 140. The active material 136 includes a form of sulfur and may be entirely sulfur. A voltage meter 142 is configured to obtain the voltage between the anode 120 and the cathode 122, and a coulomb counter 144 is provided to detect current flow into and out of the battery cell $114_1$. The coulomb counter 144, which may be located anywhere along the circuit 118 or adjacent to the cell pack $102_1$, may be used to detect current flow into and out of all of the battery cells $114_{1-5}$ in the cell pack $102_1$ since the same current will be flowing through each of the battery cells $114_{1-5}$ connected to the circuit 118.

A wireless temperature sensor assembly 146 is located within the separator region 124 of the lithium ion cell $114_1$. In other embodiments, the wireless temperature sensor assembly 146 is located within one of the electrodes. In yet other embodiments, two wireless temperature sensor assemblies 146 are provided in the lithium ion cell $114_1$, with a sensor assembly 146 located within each of the electrodes. The sensor assembly 146 in this embodiment is based upon RFID technology.

Figure 4:
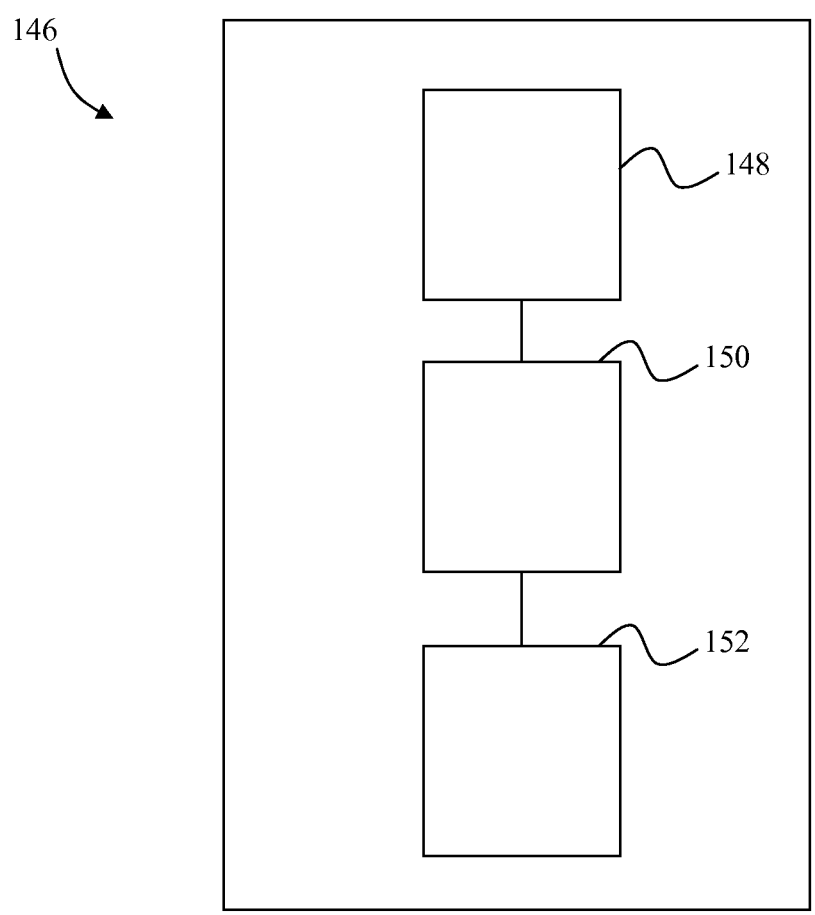
FIG. 4 depicts a block diagram of the wireless temperature sensor of FIG. 3.

As shown in FIG. 4, the sensor assembly 146 includes an RFID antenna 148, a processor 150, and a temperature sensor 152. The temperature sensor assembly 146 is activated by an RFID transponder 154 (see FIG. 1). The RFID transponder 154 is controlled by the processor 110 to obtain temperature readings of the lithium ion cell $114_1$. The sensor assembly 146 in this embodiment is powered by the RFID transponder 154. In some embodiments, the sensor assembly 146 includes a memory. In some of the embodiments, the sensor assembly 146 operates independently of the RFID transponder 154 and stores temperature data in the memory. The stored data is transmitted periodically to the RFID transponder 154. In assemblies including a memory for storage of temperature data, a separate power source or access to power available from the lithium ion cell $114_1$ is used to power the sensor assembly 146 when the RFID transponder 154 is not active.

The specific configuration of the sensor assembly 146 will depend upon the particular design of the electrochemical cells $114_x$. In many instances, a standard LF RFID solution will work. As an example, standard 18650 cells are encased in a steel shell with 0.5-0.6 mm thickness. For 19% Cu-8% Ni-0.6% W steel, the skin depth is ~2 mm at 25 kHz, so ~1 mm at 125 kHz-135 kHz. Thus, while less conductive materials and lower frequencies are preferred, it is acceptable to use any RFID frequency that penetrates the shell of the electrochemical cells $114_x$.

Additionally, in order to easily fit within the electrochemical cells $114_x$, the sensor assembly 146 is preferably about 30-50 microns thick, including a polymer packaging, which is achievable by soft lithographic techniques. With this construction, the entire sensor is flexible and can conform to the curvature of the electrode layers. This makes incorporation of the sensor compatible with standard cathode rolling or lamination process, particularly for 18650 cylindrical cells where electrodes have curved geometry. For flat pouch cells the encapsulation and substrate for the sensor and communication circuit does not need to be flexible, the materials can include a variety of materials.

The lithium-ion battery cells $114_x$ operate in a manner similar to the lithium-ion battery cell disclosed in U.S. patent application Ser. No. 11/477,404, filed on Jun. 28, 2006, the contents of which are herein incorporated in their entirety by reference. In general, with reference to battery cell $114_1$, electrons are generated at the negative electrode 120 during discharging and an equal amount of electrons are consumed at the positive electrode 122 as lithium and electrons move in the direction of the arrow 160 of FIG. 3.

In the ideal discharging of the cell $114_1$, the electrons are generated at the negative electrode 120 because there is extraction via oxidation of lithium ions from the active material 126 of the negative electrode 120, and the electrons are consumed at the positive electrode 122 because there is reduction of lithium ions into the active material 136 of the positive electrode 122. During charging, the reactions are reversed, with lithium and electrons moving in the direction of the arrow 162.

Returning to FIG. 1, the electrochemical battery cell packs $102_{1-5}$ may be used to selectively power the load/source 104 during normal discharge operations by selectively controlling the switches $106_{1-5}$ shut. Similarly, the electrochemical battery cell packs $102_{1-5}$ may be selectively recharged by the load/source 104 during normal charging operations by selectively controlling the switches $106_{1-5}$ shut. Charging and discharging of the lithium-ion battery cells $114_x$ within the cell packs $102_x$ connected to the load 104 can further be selectively controlled by selectively controlling the associated connection switch $116_x$.

In operation, one or more of the lithium-ion battery cells $114_x$ may experience increased temperature during charging or discharging operations. Accordingly, in one embodiment, the processor 110 executes command instructions stored within the memory 112 to selectively charge and discharge the electrochemical cells $114_x$. To this end, a temperature threshold may be stored in the memory 112. If, during operation, a given one of the lithium-ion battery cells $114_x$ meets or exceeds the stored threshold, the processor 110 executes command instructions stored within the memory 112 to selectively isolate the lithium-ion battery cells $114_x$ with excess temperature by controlling the switches $116_x$.

The above described system in various embodiments thus includes an internal temperature sensor for Li-ion or other battery cells that is entirely contained within the cell case and compatible with the current manufacturing process. The sensor assembly includes a thin flexible electronic circuit that is self-contained and chemically isolated from the battery materials by a thin polymer film encapsulation. The circuit includes an antenna loop to receive and send radio signals. The circuit in some embodiments is powered by externally generated radio waves in a fashion similar to RFID devices. The outgoing signal is modulated by the solid-state thermal sensing element, such as a thermocouple, and contains the information about the particular cell and the internal temperature. Thus, no external leads are required for internal temperature measurement of the electrochemical cell. Additionally, since the circuit is self-contained there is no need to weld the contacts to the tabs of the metallic current collectors, so integration can simply be achieved by placing the sensor between the electrode layers inside the battery cell.

While the invention has been illustrated and described in detail in the drawings and foregoing description, the same should be considered as illustrative and not restrictive in character. Only the preferred embodiments have been presented and all changes, modifications and further applications that come within the spirit of the invention are desired to be protected.

The invention claimed is:

1. A battery system comprising:
   a first battery cell including a first shell encasing a positive electrode, a negative electrode, and a separator positioned between the positive electrode and the negative electrode, wherein the first battery cell is configured to selectively power a load outside of the first shell; and
   at least one first wireless temperature sensor assembly encased within the first shell and configured to obtain temperature readings of the first battery cell, wherein a first of the at least one first wireless temperature sensors is located within the negative electrode.

2. The battery system of claim 1, wherein a second of the at least one first wireless temperature sensors is located within the separator.

3. The battery system of claim 1, wherein:
   the at least one first wireless temperature sensor assembly comprises a positive electrode wireless temperature sensor;
   and
   the positive wireless temperature sensor is located within the positive electrode.

4. The battery system of claim 1, wherein:
   the at least one first wireless temperature sensor assembly comprises an RFID transponder.

5. The battery system of claim 4, wherein the at least one first wireless temperature sensor assembly further comprises a polymer packaging.

6. The battery system of claim 5, wherein the polymer packaging is less than about 50 microns thick.

7. The battery system of claim 6, wherein the at least one first wireless temperature sensor further comprises:
   a thin flexible self-contained electronic circuit.

8. The battery system of claim 1, further comprising:
   a second battery cell including a second shell encasing a positive electrode, a negative electrode, and a separator positioned between the positive electrode and the negative electrode;
   at least one second wireless temperature sensor assembly encased within the second shell;
   a first switch associated with the first battery cell and including a first position whereat the first battery cell is connected to a battery cell circuit, and a second position whereat the first battery cell is electrically isolated from the battery cell circuit; and
   a second switch associated with the second battery cell and including a third position whereat the second battery cell is connected to the battery cell circuit, and a fourth position whereat the second battery cell is electrically isolated from the battery cell circuit.

9. The battery system of claim 8, further comprising:
   a memory having command instructions stored therein; and
   a processor operably connected to the at least one first wireless temperature sensor assembly, the at least one second wireless temperature sensor assembly, the first switch, the second switch, and the memory, the processor configured to execute the command instructions to
      obtain first temperature data from the at least one first wireless temperature sensor assembly,
      control the first switch based upon the first temperature data,
      obtain second temperature data from the at least one second wireless temperature sensor assembly, and
      control the second switch based upon the second temperature data.

10. The battery system of claim 9, wherein the processor is further configured to execute the command instructions to:
   compare the first temperature data to a temperature threshold;
   control the first switch to the second position if the first temperature data exceeds the temperature threshold;
   compare the second temperature data to the temperature threshold; and
   control the second switch to the fourth position if the second temperature data exceeds the temperature threshold.

* * * * *